United States Patent [19]

Tsujii et al.

[11] Patent Number: 4,615,756
[45] Date of Patent: Oct. 7, 1986

[54] DRY ETCHING APPARATUS

[75] Inventors: Kanji Tsujii, Nishitama; Yusuke Yajima, Musashino; Seiichi Murayama, Kokubunji, all of Japan

[73] Assignee: Hitachi, Ltd., Tokyo, Japan

[21] Appl. No.: 753,858

[22] Filed: Jul. 11, 1985

[30] Foreign Application Priority Data

Jul. 11, 1984 [JP] Japan .............................. 59-142316
Aug. 14, 1984 [JP] Japan .............................. 59-168843

[51] Int. Cl.$^4$ ............ H01L 21/306; B44C 1/22; C03C 15/00; C23F 1/02
[52] U.S. Cl. ............................... 156/345; 156/635; 156/643; 156/646; 156/657; 156/662; 204/192.32; 204/298
[58] Field of Search ............... 156/345, 643, 646, 657, 156/662, 635; 204/164, 192 EC, 192 E, 298; 427/38, 39, 53.1; 118/728, 50.1, 620; 219/121 L, 121 LH, 121 LJ, 121 FS, 121 LM

[56] References Cited

U.S. PATENT DOCUMENTS

| 2,841,477 | 7/1958 | Hall .............................. 156/643 X |
| 3,095,341 | 6/1963 | Ligenza ........................ 156/643 X |
| 4,260,649 | 4/1981 | Dension et al. ............. 156/635 X |
| 4,478,677 | 10/1984 | Chen et al. .................. 156/646 X |
| 4,490,211 | 12/1984 | Chen et al. .................. 156/635 X |
| 4,508,749 | 4/1985 | Brannon et al. ............ 156/643 X |

Primary Examiner—William A. Powell
Attorney, Agent, or Firm—Antonelli, Terry & Wands

[57] ABSTRACT

An etching apparatus according to the present invention comprises means to generate metastable excited species such as of nitrogen or rare gas molecules, means to transfer the metastable excited species into a reaction chamber in which a substrate to-be-etched is set, and means to introduce a reactive gas for etching into the reaction chamber in which the substrate to-be-etched is set; the reactive gas being activated by collision between the metastable excited species and the reactive gas so as to etch the substrate to-be-etched owing to a reaction between the activated reactive gas and the substrate to-be-etched. Further, a light source for photo-exciting the substrate to-be-etched may well be added.

22 Claims, 18 Drawing Figures

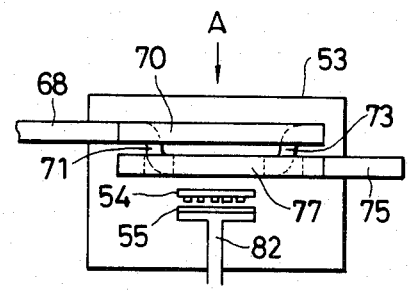
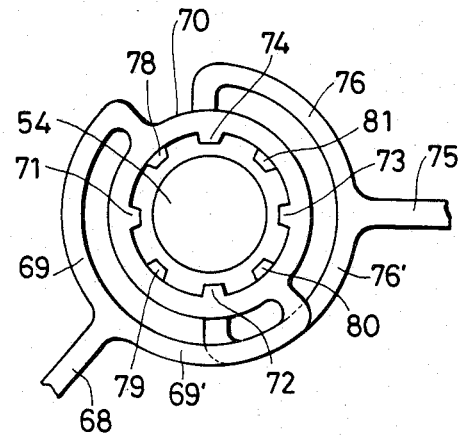
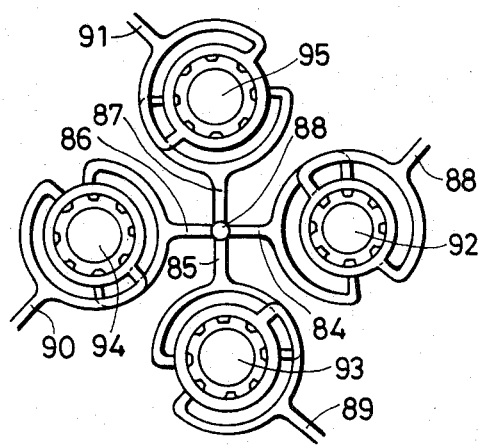

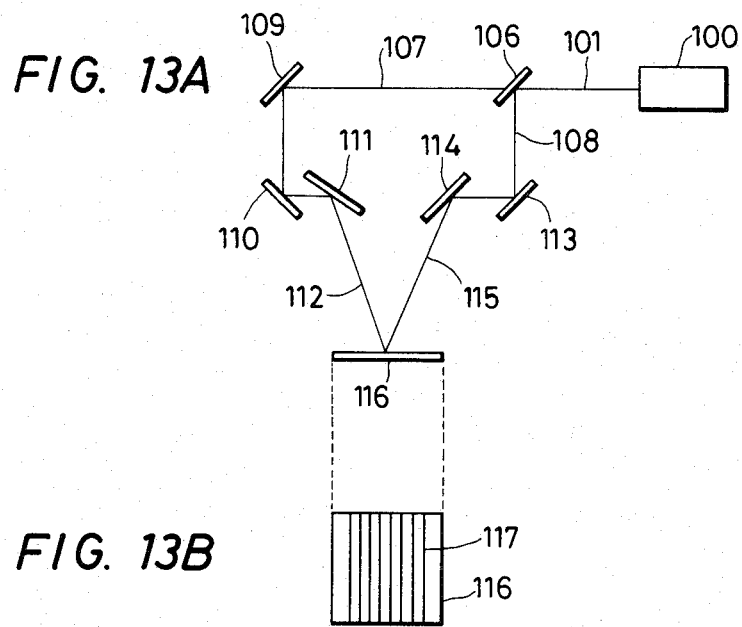

DRY ETCHING APPARATUS

BACKGROUND OF THE INVENTION

The present invention relates to improvements in a dry etching apparatus which is used in processes for manufacturing a semiconductor integrated circuit etc.

Dry etching methods for use in the manufacturing processes of a semiconductor integrated circuit etc. include a plasma etching method, a reactive sputtering etching method, etc. which are extensively applied at present. In these etching methods, a reactive gas is discharged under a reduced pressure to generate reactive species such as radicals or ions, which are reacted with the surface of a substrate for etching, thereby to perform the etching. Since such dry etching is superior to the wet chemical etching in the critical dimension controllability, it has become an increasingly important technique under the circumstances under which pattern feature dimensions have become smaller and smaller to necessitate patterning at the level of 1 μm. Since, however, the plasma etching method or the reactive sputtering etching method sets the substrate to-be-etched in a discharge cell, it involves such problems that the damage of the substrate to-be-etched is prone to occur due to charged particles and that a resist is depleted by the radiant heat of a plasma, etc. Any countermeasure has therefore been desired.

In the processes of the plasma etching method and reactive sputtering etching method mentioned above, desired patterns of microelectronic circuits are formed via a large number of steps such as resist coating, pattern exposure, development, etching and resist peeling. Techniques for forming patterns with such complicated steps curtailed sharply have been known, and the details are described in, e.g., 'Proceedings of 1983 Dry Process Symposium', page 97 (1983), and 'Electronics' (Ohm Publishing Co., Ltd., Tokyo), February 1984, page 5.

These known techniques exploit the phenomenon that, when a p+-type silicon or undoped silicon substrate set in a reaction chamber, in which a gas containing chlorine is introduced, is irradiated with light having a wavelength of approximately 300 nm (the light of an Hg-Xe lamp or an XeCl excimer laser), only a part struck by the light is etched. Although the mechanism of this phenomenon is not sufficiently grasped, it is interpreted as follows. A chlorine molecule absorbs the light of the wavelength of approximately 300 nm thereby to dissociate into radicals, while an electron created in the surface of the silicon substrate by photo-excitation is adsorbed to the chlorine atom to produce $Cl^-$, which penetrates into a positively charged silicon lattice, and the silicon crystal has its bonding dissociated and vaporizes in the form of $SiCl_x$, with the result that the etching takes place.

Owing to the technique, it is possible to sharply curtail the manufacturing steps of a large-scale integrated circuit. For efficiently photo-dissociating the chlorine gas and for raising the etching rate of the substrate, a light source which radiates high-intensity light at or near 300 nm is indispensable, and the excimer laser of XeCl or the like is deemed effective. The excimer laser, however, has the problems that it is expensive, that the power lowers gradually with operation, and that the laser gas must be periodically changed.

Another known example close to the present invention is the technique of maskless etching based on laser irradiation. In case of employing a laser as a light source, the merits of the laser; excellent directionality and focalizability can be exploited, and a microscopic etching pattern can be depicted directly without the intervention of a mask in such a way that the surface of a substrate to be etched is scanned by a fined laser beam. There is an example wherein a microscopic etching pattern was depicted on single-crystal and polycrystalline silicon by utilizing chlorine or hydrogen chloride as a reactive gas and an $Ar^+$ laser as means for activating the gas. The details are described in 'Appl. Phys. Lett.', 38(12), 1018 (1981).

According to the paper, since the wavelength of light radiated from the $Ar^+$ laser is separate from the center (330 nm) of the absorption spectrum of the chlorine gas, laser irradiation at high power (about 7 W) is required for efficient etching. Regarding the hydrogen chloride whose absorption band is entirely separate from the wavelength of the $Ar^+$ laser light, a remarkable etching effect was observed for the first time when the $Ar^+$ laser was operated at a power higher than 4 W. It is described that the etching is promoted by projecting the laser light of such high power and heating the substrate nearly into a melted state. In this manner, in the case of using the $Ar^+$ laser in the prior art, there is the problem that expensive laser equipment capable of producing the high power is indispensable. it is also considered to replace the $Ar^+$ laser with the excimer laser, but the excimer laser has the problems as described before and the practical use is difficult.

SUMMARY OF THE INVENTION

It is accordingly a first object of the present invention to overcome the disadvantages mentioned above and to provide an etching apparatus which suppresses the damage of a substrate ascribable to charged particles and the depletion of a resist ascribable to radiant heart from a plasma.

A second object of the present invention is to solve the problems mentioned above and to provide a dry etching apparatus which forms a desired pattern without using a resist.

The present invention for accomplishing the first object is characterized by a construction of an etching apparatus comprising means to generate metastable excited species such as of nitrogen or rare gas molecules, means to transfer the metastable excited species into a reaction chamber in which a substrate to-be-etched is set, and means to introduce a reactive gas for etching into said reaction chamber in which the substrate to-be-etched is set; the reactive gas being activated by collision between the metastable excited species and the reactive gas so as to etch the substrate to-be-etched owing to a reaction between the activated reactive gas and the substrate to-be-etched.

The present invention for accomplishing the second object is characterized by a construction comprising a light source which irradiates a substrate to-be-etched, set in a reaction chamber, with light, means to introduce a reactive gas into said reaction chamber, means to generate metastable excited molecules, and means to introduce the metastable excited molecules into said reaction chamber; the reactive gas being activated by a reaction between the metastable excited molecules and the reactive gas introduced into said reaction chamber so as to etch a light-irradiated part of a surface of the substrate owing to a reaction between the activated reactive gas and the surface of the substrate to-be-etched.

Since the substrate to-be-etched is permitted by such characterizing construction of the present invention to be etched at a position distant from a charged particle or plasma generating portion, dry etching at low temperatures becomes possible which suppresses the damage of the substrate attributed to charged particles or the depletion of a resist attributed to radiant heat from a plasma.

Further, according to the dry etching apparatus of the present invention, the reactive gas is activated by utilizing the metastable excited molecules, whereby a light source which is inexpensive, stable and long in lifetime can be used as the light source for photo-exciting the substrate to-be-etched, and it becomes possible to put resistless etching or maskless etching into practical use.

BRIEF DESCRIPTION OF THE DRAWINGS

FIGS. 2A and 2B are partial setup diagrams of a successive single wafer etching apparatus being a second embodiment of the present invention, in which FIG. 2A is a front view thereof and FIG. 2B is a top plan view thereof;

FIGS. 3A and 3B are partial setup diagrams of an apparatus for etching a plurality of substrates in parallel, being a third embodiment of the present invention, in which FIG. 3A is a front view thereof and FIG. 3B is a top plan view thereof;

FIGS. 6A and 6B are schematic setup diagrams of an apparatus being a sixth embodiment of the present invention;

FIG. 7 is a schematic setup diagram of an apparatus being a seventh embodiment of the present invention;

FIG. 13 is a schematic setup diagram of an apparatus being a thirteenth embodiment of the present invention.

DESCRIPTION OF THE PREFERRED EMBODIMENTS

Now, the present invention will be described in detail with reference to the drawings. First, the principle of the present invention will be explained.

In the present invention, the metastable excited species of nitrogen or a rare gas having a comparatively long lifetime are employed for the activation of a reactive gas. For example, metastable excited nitrogen molecules $N_2^*(A^3\Sigma u^+)$ have an excitation energy of 6.17 eV and remain in the excited state for a long time (the lifetime being 2.1 seconds). In consequence, in a case where the molecules $N_2^*(A^3\Sigma u^+)$ have been produced by an electric discharge or the like, they remain in that state even when the nitrogen molecules are transferred to a position which is distant from a discharge generating portion being in a plasma state. The molecule $N_2^*(A^3\Sigma u^+)$ collides with another chemical species and thus transmits energy to the opposite party, to excite or dissociate the energy accepted chemical species. A technique for forming an $Si_3N_4$ film by utilizing this phenomenon has been known, and is described in the Official Gazette of Japanese Patent Application Publication No. 58-27656. With the apparatus, since the reaction proceeds at a position isolated from a plasma generating portion, the thin film can be formed under the condition that the influence of the charged particles is almost eliminated.

The present invention therefore intends to utilize such metastable excited species having the long lifetime, for means to activate an etching gas. More specifically, metastable excited species such as of nitrogen or rare gas molecules are generated and are transferred into a reaction chamber, while at the same time a reactive gas for etching is introduced into the reaction chamber. Then, the metastable excited species collide with the reactive gas to activate the latter. The activated reactive gas reacts with a substrate to-be-etched set in the reaction chamber, and etches the substrate.

Further, along with a light source for photo-exciting a semiconductor substrate to-be-etched, metastable excited molecules are utilized as means for dissociating and activating a reactive gas, thereby to etch the substrate.

Next, the present invention will be described in conjunction with practicable embodiments.

Figure 1:
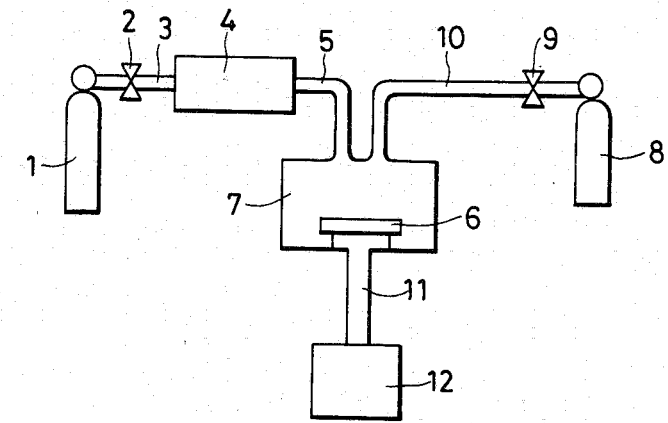
FIG. 1 is a fundamental setup diagram of a first embodiment of an etching apparatus according to the present invention.

FIG. 1 shows a first embodiment of the present invention. Numeral 1 designates a reservoir for nitrogen or a rare gas. By way of example, nitrogen gas supplied from the gas reservoir 1 passes through a valve 2 as well as a tube 3 and is converted into metastable excited molecules $N_2^*(A^3\Sigma u^+)$ in a metastable excited species-generating portion 4. As methods for the conversion, microwave discharge and dielectric discharge are effective. The metastable excited molecules produced in the generating portion 4 are introduced via a tube 5 into a reaction chamber 7 in which a substrate to-be-etched 6 is set. On the other hand, a reactive gas containing hologen supplied from a reservoir 8 for the reactive gas is introduced into the reaction chamber 7 via a valve 9 as well as a tube 10. Since the metastable excited molecules $N_2^*(A^3\Sigma u^+)$ produced in the generating portion 4 have a lifetime of 2.1 seconds, they remain in the excited state even at the time at which they have been introduced into the reaction chamber 7. As a result, the reactive gas introduced into the reaction chamber 7 via the tube 10 collides with the metastable excited molecules $N_2^*(A^3\Sigma u^+)$ and is converted into active chemical species, which etch the substrate 6. A gas produced by the etching is eliminated by an evacuation (or vacuum) pump 12 via tube 11.

Figure 2A:
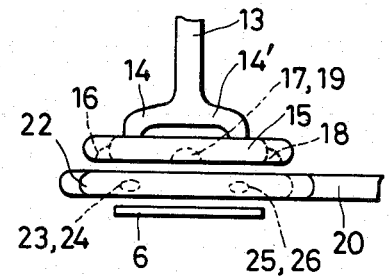
Figure 2B:
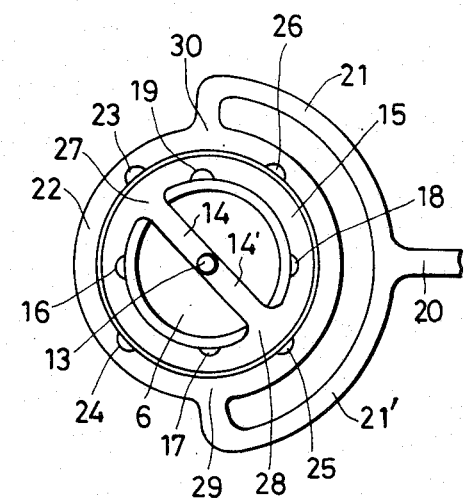

FIGS. 2A and 2B show partial apparatus setup diagrams of the interior of a reaction chamber 7 in an etching apparatus which is a second embodiment of the present invention and which is well suited for uniformly etching the surfaces of substrates 6 in the system of etching the substrates 6 one by one (in conformity with a successive single wafer processing method). FIG. 2A is a front view thereof, and FIG. 2B a top plan view. The metastable excited molecules generated in the metastable excited species-generating portion 4 shown in FIG. 1 pass via the tube 5 and via a tube 13 and branched tubes 14 and 14' in FIGS. 2A and 2B, and are thereafter introduced into the reaction chamber (not shown) through four ports 16, 17, 18 and 19 provided in a circular tube 15. On the other hand, the reactive gas arriving via the tube 10 in FIG. 1 passes via a tube 20 and branched tubes 21 and 21' in FIGS. 2A and 2B, whereupon it is introduced into the reaction chamber through four ports 23, 24, 25 and 26 provided in a circular tube 22. The ports 16 and 19 for introducing the metastable excited molecules into the reaction chamber and those 17 and 18 are respectively equidistant from the junction 27 between the branched tube 14 and the circular tube 15 and from the junction 28 between the branched tube 14' and the circular tube 15, and the respective ports 16-19 are located at symmetric positions at which the circular tube 15 is quartered. In addition, the four ports 23-26 for introducing the reactive gas into the reaction chamber are equidistant from the junctions 29 and 30 between the branched tubes 21 and 21' and the circular tube 22, and the respective ports 23-26 are located at symmetric positions which quarter the circular tube 22. Though not shown in FIG. 2A, a tube 11 for eliminating the gas produced by the etching is disposed under the substrates 6 as in FIG. 1. Owing to the above setup, the metastable excited molecules and the reactive gas introduced into the reaction chamber react uniformly near the surfaces of the substrates 6 and produce the active chemical species, which etch the surfaces of the substrates 6 uniformly.

Figure 3A:
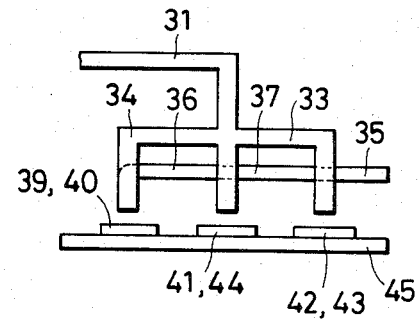
Figure 3B:
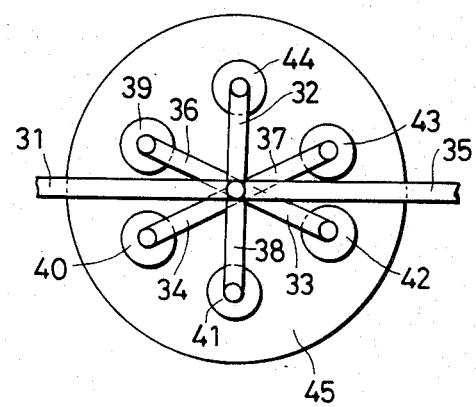

FIGS. 3A and 3B show the partial setup of an etching apparatus which is a third embodiment of the present invention and which is well suited to etch a plurality of substrates 39-44 in parallel. FIG. 3A is a front view, while FIG. 3B is a top plan view. The metastable excited molecules generated in the metastable excited species-generating portion as shown in FIG. 1 pass via a tube 31, whereupon they are introduced into the reaction chamber through branched tubes 32, 33 and 34 extending radiately. On the other hand, the reactive gas passes via a tube 35 and is thereafter introduced into the reaction chamber through branched tubes 36, 37 and 38 extending radiately. The substrates 39, 40, 41, 42, 43 and 44 are set on a substrate stage 45. Though not shown in the figures, an evacuation port is provided under the substrate stage 45, from which the gas produced by the etching is eliminated.

While the substrate is illustrated in the fixed state in the embodiment of FIG. 1, FIGS. 2A and 2B or FIGS. 3A and 3B, it is also possible to furnish the substrate stage with a rotation facility in order to uniformly etch the surface of the substrate. Especially in the apparatus for processing the plurality of substrates in parallel as shown in FIG. 3, it is also possible to employ a facility for rotating the individual substrates on the substrate stage 45 besides the facility for rotating the substrate stage 45. In the embodiment of FIGS. 2A and 2B, the metastable excited molecules and the reactive gas are respectively introduced into the reaction chamber via the upper circular tube 15 and via the lower circular tube 22, but a similar effect is attained even when the vertical positional relation of the circular tubes 15 and 22 is reversed. In addition, while in the embodiment of FIGS. 2A and 2B the diameter of the lower circular tube 22 is larger than that of the upper circular tube 15, both the diameters may be altered to be approximately equal. Further, while in the embodiment of FIGS. 2A and 2B the ports are provided in the four places in each of the circular tubes 15 and 22, their number can be increased or decreased to a desired one. In that case, however, the number of the branched tubes should desirably be increased or decreased so that the flow rates of the gas to be introduced from the respective ports into the reaction chamber may be adjusted to equal levels. Besides, in the embodiment of FIGS. 3A and 3B, uniform etching in the substrates 39, 40, 41, 42, 43 and 44 can be achieved in such a way that each of the fore end parts of the branched tubes 32, 33 and 34 for introducing the metastable excited molecules and the branched tubes 36, 37 and 38 for introducing the reactive gas is put into the circular tube structure having the plurality of ports as shown in the embodiment of FIGS. 2A and 2B.

Figure 4:
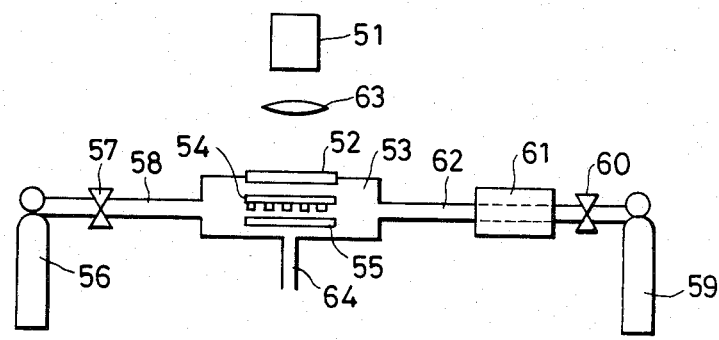
FIG. 4 is a schematic setup diagram of a dry etching apparatus being a fourth embodiment of the present invention.

FIG. 4 is a schematic setup diagram showing a dry etching apparatus which is a fourth embodiment of this present invention.

Light emergent from a light source 51 passes through a window 52, and thereafter irradiates the surface of a semiconductor substrate to-be-etched 55, for example, a P-type or undoped silicon substrate via a mask 54 which is set in a reaction chamber 53 and on which a desired pattern is depicted. A reactive gas having flowed out of a reactive gas reservoir 56, for example, a gas containing chlorine is introduced into the reaction chamber 53 via a valve 57 and a tube 58. On the other hand, a gas, for example, nitrogen or rare gas which is used for generating metastable excited molecules and which has come out of a metastable excited molecule-generating gas reservoir 59 passes via a valve 60 and is thereafter converted into the metastable excited molecules in a metastable excited molecule-generating portion 61. As means for the conversion into the metastable excited molecules in the metastable excited molecule-generating portion 61, a discharge system such as microwave discharge or dielectric discharge is suitable. For example, in case of employing the nitrogen gas as the gas for generating the metastable excited molecules, it is converted into metastable excited molecules $N_2^*(A^3\Sigma u+)$ in the metastable excited molecule-generating portion 61. Since the metastable excited molecules have an excitation energy of 6.17 eV and remain in the excited state for a long time (the lifetime being 2.1 seconds), they are in the excited state even at the stage at which they have entered the reaction chamber 53 via a tube 62. The metastable excited molecules introduced into the reaction chamber 53 collide with the reactive gas, to activate this reactive gas. The activated reactive gas etches that part of the surface of the semiconductor substrate to-be-etched 55 set in the reaction chamber 53 which has been irradiated by the light source 51 through the mask 54. Numeral 63 indicates a lens, and numeral 64 a gas outlet tube.

Figure 5:
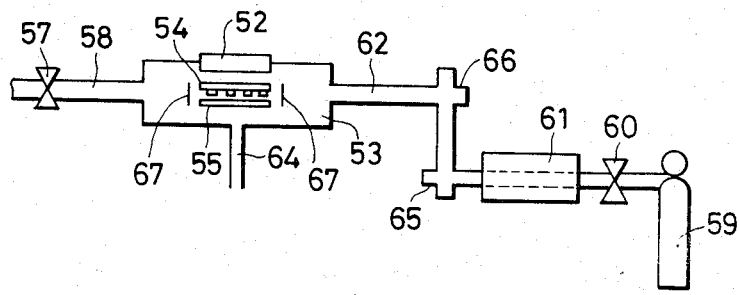
FIG. 5 is a schematic setup diagram of an apparatus being a fifth embodiment of the present invention.

FIG. 5 is a diagram showing a fifth embodiment of the present invention. The present embodiment has been contrived lest light emitted in the metastable excited molecule-generating portion 61 should enter the reaction chamber 53. For example, when the nitrogen or rare gas from the metastable excited molecule-generating gas reservoir 59 is converted into the metastable excited molecules in the metastable excited molecule-generating portion 61 by the discharge, intense light emission based on a plasma is seen inside the metastable excited molecule-generating portion 61. When the light developed on this occasion arrives at the semiconductor substrate to-be-etched 55 in the reaction chamber 53, the etching proceeds also in the surface of the substrate at which the light has arrived, and hence, the etching conforming to the desired pattern depicted on the mask 54 becomes impossible. In the embodiment shown in FIG. 5, the tube 62 which extends from the metastable excited molecule-generating portion 61 to the reaction chamber 53 is provided with turnings 65 and 66, whereby the light emitted in the metastable excited molecule-generating portion 61 is prevented from entering the reaction chamber 53. Besides, in order to suppress the incidence of light from the gap between the mask 54 and the semiconductor substrate to-be-etched 55, a screen 67 is disposed so as to surround the mask 54 and the semiconductor substrate to-be-etched 55. Though not shown in the figure, the outer wall of, for example, a transparent silica tube extending from the metastable excited molecule-generating portion 61 to the reaction chamber 53 is blackened in order to suppress the inner surface reflection of the tube.

FIGS. 6A and 6B are diagrams showing a sixth embodiment of the present invention. The present embodiments has been contrived for introducing the etching gas and the metastable excited molecules so that they may be uniformly distributed in the gap between the mask 54 and the semiconductor substrate to-be-etched 55. FIG. 6A is a front view thereof, and FIG. 6B is a top plan view. The reactive gas having come out of the reactive gas reservoir (not shown, and refer to FIG. 4) is introduced into the reaction chamber via a tube 68, branched tubes 69 and 69' (omitted from the illustration of FIG. 6A) and gas inlet ports 71, 72, 73 and 74 provided in a circular tube 70. On the other hand, the gas which has come out of the metastable excited molecule-generating gas reservoir (not shown) and which has been converted into the metastable excited molecules in the metastable excited molecule-generating portion is introduced into the reaction chamber via a tube 75, branched tubes 76 and 76' (omitted from the illustration of FIG. 6A) and gas inlet ports 78, 79, 80 and 81 provided in a circular tube 77. In the embodiment of FIGS. 6A and 6B, the gas inlet ports 71, 72, 73 and 74 which extend downwards from the circular tube 70 for introducing the reactive gas are provided to be even with the circular tube 77 which is disposed under the circular tube 70 and which introduces the metastable excited molecules. That is, the inlet ports 71, 72, 73 and 74 for the reactive gas and the inlet ports 78, 79, 80 and 81 for the metastable excited molecules are provided at even positions of respectively equal intervals. For example, angles defined between the inlet port 71 for the reactive gas and the inlet ports 78 and 79 for the metastable excited molecules are 45° (as viewed from the center of the mask 54).

In the present embodiment, the mask 54 and the semiconductor substrate to-be-etched 55 set in opposition to the mask 54 are illustrated below the circular tube 77. In performing the etching, however, a substrate stage 82 is moved up by a device not shown, thereby to adjust the components 54 and 55 so as to come onto the same plane on which the inlet ports 71, 72, 73 and 74 for the reactive gas and the inlet ports 78, 79, 80 and 81 for the metastable excited molecules lie. The light for irradiating the semiconductor substrate to-be-etched 55 through the mask 54 enters in the direction of an arrow A in FIG. 6A.

In FIG. 6A, a light window and a gas exhaust tube with which the reaction chamber 53 is to be furnished are not shown.

FIG. 7 is a diagram showing a seventh embodiment of the present invention. The present embodiment has been contrived in order to simultaneously etch a plurality of substrates. Shown in the figure is a system which processes four substrates at the same time. The present embodiment has a setup in which the apparatuses as shown in the embodiment of FIGS. 6A and 6B are combined in parallel in the number of four. The metastable excited molecules of nitrogen, a rare gas or the like pass via branched tubes 84, 85, 86 and 87 extending radiately from a tube 83, and thereafter spurt into the reaction chamber via the paths stated in the embodiment of FIGS. 6A and 6B. On the other hand, the reactive gas diverges into four branched tubes via the reactive gas reservoir and a gas flow regulating system, now shown, and flows into tubes 88, 89, 90 and 91 in FIG. 7. The gas having flowed in spurts into the reaction chamber via the paths stated in the embodiment of FIGS. 6A and 6B. in FIG. 7, numerals 92, 93, 94 and 95 indicate masks which are set near the corresponding gas inlet ports.

Figure 8:
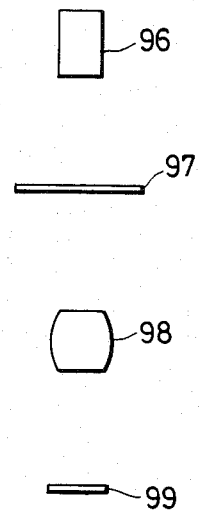
FIG. 8 is a schematic setup diagram of an apparatus being an eighth embodiment of the present invention.
Figure 9:
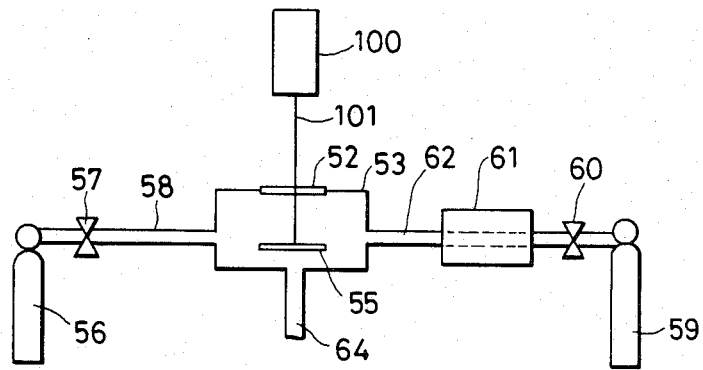
FIG. 9 is a schematic setup diagram of an apparatus being a ninth embodiment of the present invention.

FIG. 8 is a diagram showing an eighth embodiment of the present invention. In the fourth to seventh embodiments, the image of the mask is projected on the substrate to-be-etched through the mask by an exposing method of 1:1 projection (or proximity printing). In contrast, the present embodiment adopts a reduction projection aligner in order to depict an etching pattern on the surface of a semiconductor substrate to-be-etched. FIG. 8 shows a device for reduction projection. Numeral 96 designates a light source for exposure, numeral 97 a mask, numeral 98 a reduction lens, and numeral 99 the semiconductor substrate to-be-etched. In the drawing, the outer wall of a reaction chamber, inlet ports for a reactive gas and metastable excited molecules, a gas exhaust tube, etc. are omitted. The mask 97 bears an enlarged view of a pattern of desired dimensions which is to be depicted on the semiconductor substrate to-be-etched 99. Light emitted from the light source 96 passes through the mask 97, thereafter enters the reduction lens 98, and finally depicts the pattern of desired dimensions on the surface of the semiconductor substrate to-be-etched 99. Though not shown in the figure, a microscopic pattern needs to be formed every exposure region at a fixed position on the semiconductor substrate to-be-etched in the reduction projection aligner, so that precise control techniques for the loading, positioning etc. of the substrate are required.

FIG. 9, FIG. 10, and FIGS. 11A and 11B are diagrams showing ninth to eleventh embodiments of the present invention, respectively. The ninth to eleventh embodiments employ a laser as a light source and scan the surface of a semiconductor substrate to-be-etched by means of a fined laser beam, thereby to etch the substrate surface into a desired pattern without using any mask. The ninth embodiment corresponds to the fourth embodiment, the tenth embodiment to the fifth embodiment, and the eleventh embodiment to the sixth embodiment. In the figures, numeral 100 indicates the laser source and numeral 101 the laser beam, and the other symbols denote the same portions as shown in FIG. 3 to FIGS. 6A and 6B.

In each of the ninth to eleventh embodiments, the metastable excited molecules produced from the metastable excited molecule-generating portion 61 are introduced into the reaction chamber 53, and they collide with the reactive gas introduced from the reactive gas reservoir 56, to activate this reactive gas. The activated reactive gas etches that part of the surface of the semiconductor substrate to-be-etched 55 set in the reaction chamber 53 which has been photo-excited under irradiation with the laser beam 101. The scanning method of the laser beam 101 in each of the ninth to eleventh embodiments is, for example, such that the radiant space of the laser beam 101 is fixed, whereas the substrate stage carrying the semiconductor substrate to-be-etched 55 is moved.

Figure 11A:
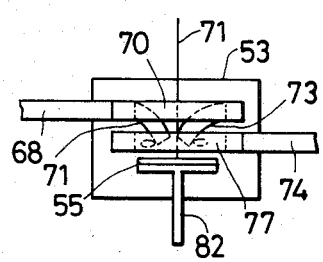
FIGS. 11A and 11B are schematic setup diagrams of an apparatus being an eleventh embodiment of the present invention.
Figure 11B:
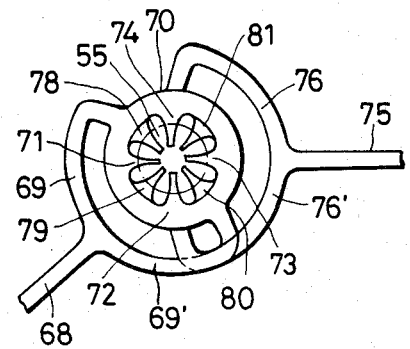

In FIG. 11A, the illustration of the light window and the gas exhaust tube with which the reaction chamber 53 is to be furnished is omitted as in FIG. 6A.

Figure 12:
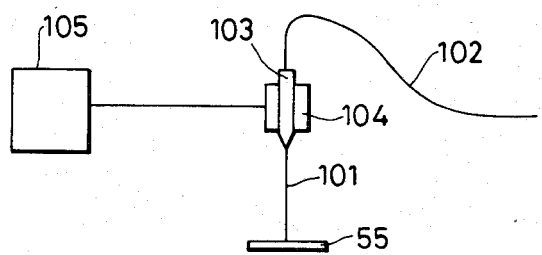
FIG. 12 is a schematic setup diagram of an apparatus being a twelfth embodiment of the present invention.

FIG. 12 is a diagram showing a twelfth embodiment of the present invention. The present embodiment is such that a laser beam is scanned using an optical fiber and a photocoupler, so as to depict a desired etching pattern on a semiconductor substrate to-be-etched. The outer wall of a reaction chamber, inlet ports for a reactive gas and metastable excited molecules, an exhaust tube for a gas, a substrate stage, etc. are omitted in FIG. 12. In the present embodiment, the laser beam 101 is conveyed by an optical fiber cable 102 and irradiates the semiconductor substrate to-be-etched 55 through the photocoupler 103 in which a microlens etc. are assembled. The photocoupler 103 fixed by fittings 104 is moved by the operation of a control unit 105 so as to depict the desired pattern, thereby irradiating the semiconductor substrate to-be-etched 55.

FIGS. 13A and 13B are diagrams showing a thirteenth embodiment of the present invention. The present embodiment is such that two laser beams are caused to interfere, and that the resulting interference fringe is utilized for depicting a microscopic striped etching pattern on a semiconductor substrate to-be-etched. In FIGS. 13A and 13B, the other constituents of the apparatus are omitted as in FIG. 12. The laser beam 101 emitted from the laser source 100 is split into laser beams 107 and 108 by a semitransparent mirror 106. Thereafter, the laser beam 107 is reflected by mirrors 109, 110 and 111 and becomes the laser beam 112, while the laser beam 108 is reflected by mirrors 113 and 114 and becomes the laser beam 115. The two laser beams 112 and 115 interfere with each other, and form the interference fringe 117 on the semiconductor substrate to-be-etched 116. In the bright parts of the interference fringe 117, the semiconductor substrate to-be-etched 116 reacts with the active gas resulting from the collision between the metastable excited molecules and the reactive gas and is etched.

As described above, in the fourth to thirteenth embodiments, metastable excited molecules produced outside a reaction chamber are introduced into the reaction chamber and are caused to collide with a reactive gas, thereby to activate the reactive gas. Meanwhile, a laser source of high stability and long lifetime, for example, Ar+ laser or He-Ne laser, or any of various discharge tubes etc. can be used for the photo-excitation of a semiconductor substrate to-be-etched. Therefore, problems involved in case of using an excimer laser as a light source, such as expensiveness, lowering in intensity with operation and frequent changes of a discharge gas, are eliminated, and the resistless etching or maskless etching becomes possible. Also in case of using the radiation of the Ar+ laser, the etching is possible without projecting a laser beam of high power as in the prior art.

In these embodiments, light radiated from the light source or a fined laser beam is used for photo-exciting the surface of the semiconductor substrate to-be-etched or the specified microscopic region thereof. Accordingly, the light or the laser beam need not have the function of photo-dissociating or thermally dissociating the reactive gas, but it may well have the function of the photo-dissociation or the thermal dissociation. For example, in case of using chlorine gas as the reactive gas, light at a wavelength of about 300 nm agreeing with the absorption band of the chlorine gas, e.g., a beam from an excimer laser of XeCl or a radiant flux from a high pressure mercury vapor lamp may well be projected. The Ar+ laser lying at the foot of the above absorption band may well be operated at a high power of approximately 4 W so as to heat the substrate up to the melting point thereof. In this case, there is attained the synergy in which the metastable excited molecules produced in the metastable excited molecule-generating portion 61 in FIG. 4 by way of example activate the reactive gas in the reaction chamber 53, and besides, the reactive gas is activated by the light irradiation effect.

Figure 10:
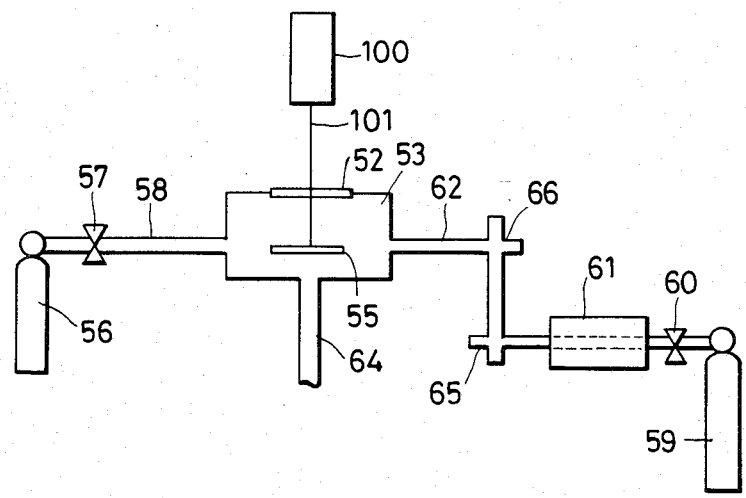
FIG. 10 is a schematic setup diagram of an apparatus being a tenth embodiment of the present invention.

While in the fifth and tenth embodiments shown in FIG. 5 and FIG. 10, the two turnings 65 and 66 are provided in order that the emitted light flux appearing in the metastable excited molecule-generating portion 61 may be prevented from entering the reaction chamber 53, it is needless to say that an increased number of turnings may well be provided. Besides, while in FIGS. 5 and 10, the turnings are bent orthogonally, a similar effect is attained and the entry of the light flux into the reaction chamber 53 can be lessened even when a tube detours spirally.

While in the sixth and eleventh embodiments shown in FIGS. 6A and 6B and FIGS. 11A and 11B, the circular tube 70 guides the reactive gas and the circular tube 77 guides the metastable excited molecules, the vertical positional relation of the circular tubes 70 and 77 may of course be reversed so as to introduce the metastable excited molecules into the reaction chamber through the circular tube 70 and the reactive gas through the circular tube 77. Besides, while in each of the sixth and eleventh embodiments, the circular tube 70 or 77 is provided with the four gas inlet ports, these ports may well be increased or decreased to a desired number. In that case, however, the quantities of the metastable excited molecules and the reactive gas need to become uniform on the semiconductor substrate to-be-etched 55, and the number of the branched tubes 69, 69', 76 and 76' should desirably be increased or decreased with the increase or decrease in the number of the gas inlet ports so as to substantially equalize the flow rates of the two gases which are introduced from the respective inlet ports into the reaction chamber.

When in the eleventh embodiment, the whole sizes (diameters) of the circular tubes 70 and 77 are reduced, each of these circular tubes 70 and 77 may well be directly provided with a plurality of openings without forming the gas inlet ports protuberant from the circular tube. In that case, it is desirable that the diameter of the upper circular tube 70 be smaller than the diameter of the lower circular tube 77 and that the openings of the circular tube 70 be provided at positions lower than the center of the tube. Owing to such arrangement, the activated reactive gas can be efficiently led onto the semiconductor substrate to-be-etched.

While in the eighth embodiment shown in FIG. 8, the mask 97 is set in opposition to and in parallel with the semiconductor substrate to-be-etched 99, it can be set at a desired position when the apparatus is furnished with a facility for reflecting light through a mirror or the like. Also such case is covered within the purport of the present invention that the mask 97 and the semiconductor substrate to-be-etched 99 are set in the state in which they oppose to each other.

With the arrangement shown in FIG. 8, the spacing between the substrate 99 and the mask 97 can be made great, so that the metastable excited molecules can be uniformly distributed on the substrate 99 advantageously. Accordingly, the arrangement may be used even when the image of the mask 97 is not reduced. Further, to the end of enhancing uniformity in the distribution of the metastable excited molecules, it is effective to generate the uniform flow or turbulent flow of a gas over the substrate 99.

In the foregoing embodiments, the reactive gas containing chlorine covers, not only chlorine gas, but also gases whose molecular formulas have chlorine atoms therein.

As the gas for generating the metastable excited molecules, it is possible to utilize a monoatomic molecule such as rare gas, diatomic molecule such as nitrogen or oxygen, or a polyatomix molecule of at least three atoms such as nitrogen dioxide or nitrous oxide. However, it is desirable for effectively performing the present invention that the lifetimes of the metastable excited molecule resulting from the gaseous molecule and the dissociation of the gaseous molecule be at least 10 ms. Further, in order to attain uniformity in the reaction on the substrate, the lifetimes need to be longer and are desired to be at least 100 ms.

As thus far described, according to the present invention, a substrate to-be-etched can be etched at a position distant from charged particles or a plasma generating portion, and dry etching at low temperatures which suppresses the damage of the substrate attributed to the charged particles or the depletion of a resist attributed to radiant heat from a plasma becomes possible.

Furthermore, according to the dry etching apparatus of the present invention, a reactive gas is activated by utilizing metastable excited molecules, whereby a light source of low price, stable operation and long lifetime can be used as a light source for photo-exciting a semiconductor substrate to-be-etched, and resistless etching or maskless etching can be put into practical use.

The embodiments of FIG. 1 to FIGS. 3A and 3B are suitable as a method of etching the whole surface of a substrate, while the embodiments of FIG. 4 to FIGS. 13A and 13B are suitable as a method of etching a light-irradiated part in the surface of a substrate. Although the difference of the phenomena of both the methods has not been fully clarified, the etching of the substrate varies depending upon the property of the substrate (for example, N+ silicon, P+ silicon or undoped silicon), the kind of a reactive gas (for example, chloric gas or fluoric gas), etc.

What is claimed is:

1. A dry etching apparatus comprising means to generate metastable excited species, means to transfer the metastable excited species into a reaction chamber in which a substrate to-be-etched is set, and means to introduce a reactive gas for etching into said reaction chamber in which the substrate to-be-etched is set; the reactive gas being activated by collision between the metastable excited species and the reactive gas so as to etch the substrate to-be-etched owing to a reaction between the activated reactive gas and the substrate to-be-etched.

2. A dry etching apparatus according to claim 1, wherein the metastable excited species are metastable excited species of one member selected from the group consisting of nitrogen and a rare gas.

3. A dry etching apparatus comprising a light source which irradiates a substrate to-be-etched, set in a reaction chamber, with light, means to introduce a reactive gas into said reaction chamber, means to generate metastable excited molecules, and means to introduce the metastable excited molecules into said reaction chamber; the reactive gas being activated by a reaction between the metastable excited molecules and the reactive gas introduced into said reaction chamber so as to etch a light-irradiated part of a surface of the substrate owing to a reaction between the activated reactive gas and the surface of the substrate to-be-etched.

4. A dry etching apparatus as defined in claim 3, wherein a mask bearing a desired pattern is set between the substrate to-be-etched and said light source.

5. A dry etching apparatus as defined in claim 3, wherein the reactive gas is a gas which contains chlorine.

6. A dry etching apparatus as defined in claim 3, wherein the substrate to-be-etched is one selected from the group consisting of P-type and undoped silicon substrates.

7. A dry etching apparatus as defined in claim 3, wherein a tube which connects said means to generate metastable excited molecules and said reaction chamber is provided with at least one turning.

8. A dry etching apparatus as defined in claim 3, wherein said means to generate metastable excited molecules and said reaction chamber are connected by a transparent tube, and a wall of said tube is provided with a coating which reduces a reflective efficiency for the light.

9. A dry etching apparatus as defined in claim 3, wherein a light screen which intercepts light appearing from said means to generate metastable excited molecules is disposed so as to surround the substrate to-be-etched in said reaction chamber.

10. A dry etching apparatus as defined in claim 3, wherein said light source radiates the light in a wavelength region which photo-dissociates the reactive gas.

11. A dry etching apparatus as defined in claim 3, wherein said light source radiates the light in a wavelength region which is not pertinent to photo-dissociation of the reactive gas.

12. A dry etching apparatus as defined in claim 3, wherein a reduction projection aligner is employed.

13. A dry etching apparatus as defined in claim 3, wherein in said reaction chamber, a plurality of inlet ports for either of the reactive gas and the metastable excited molecules are circularly provided in a substantially identical plane, and the substrate to-be-etched is set inside the circular inlet ports.

14. A dry etching apparatus as defined in claim 13, wherein the circularly arranged inlet ports for at least either of the reactive gas and the metastable excited molecules are constructed of one member selected from the group consisting of open ends of a circular tube projecting inwards and a plurality of openings directly provided in said circular tube.

15. A dry etching apparatus as defined in claim 13, wherein the substrate to-be-etched can be moved in a direction perpendicular to the aforementioned plane.

16. A dry etching apparatus as defined in claim 13, wherein a plurality of devices are comprised in each of which inlet ports for the reactive gas and the metastable excited molecules are circularly provided in a substantially identical plane, and the substrate to-be-etched is set inside the circular inlet ports so as to etch this substrate to-be-etched, and wherein the reactive gas and the metastable excited molecules are respectively introduced into said reactive chamber through the corresponding inlet ports via independent and branched tubes, to simultaneously etch the plurality of substrates to-be-etched.

17. A dry etching apparatus as defined in claim 3, wherein said light source is a laser source.

18. A dry etching apparatus as defined in claim 17, wherein a radiant space of a laser beam which is projected from said laser source is fixed, and a substrate stage which carries the substrate to-be-etched is moved, thereby to depict a desired etching pattern.

19. A dry etching apparatus as defined in claim 17, wherein a laser beam which is projected from said laser source is transmitted to a photocoupler through an optical fiber, the substrate to-be-etched is irradiated with the laser beam which emerges from said photocoupler, and said photocoupler is moved, thereby to depict a desired etching pattern.

20. A dry etching apparatus as defined in claim 17, wherein a laser beam which is projected from said laser source is divided in two, and an interference fringe is formed on the surface of the substrate to-be-etched by an interference effect of the divided laser beams, thereby to form a microscopic etching pattern.

21. A dry etching apparatus as defined in claim 17, wherein said laser source radiates the light in a wavelength region which pertains to either of photo-dissociation or thermal dissociation of the reactive gas.

22. A dry etching apparatus as defined in claim 17, wherein said laser source radiates the light in a wavelength region which pertains to neither of photo-dissociation nor thermal dissociation of the reactive gas.

* * * * *